United States Patent [19]
Laws

[11] Patent Number: 5,440,271
[45] Date of Patent: Aug. 8, 1995

[54] INTEGRATED CIRCUIT AMPLIFIER ARRANGEMENTS

[75] Inventor: Peter G. Laws, Swindon, England

[73] Assignee: Plessey Semiconductors Limited, United Kingdom

[21] Appl. No.: 191,281

[22] Filed: Feb. 2, 1994

[30] Foreign Application Priority Data

Feb. 17, 1993 [GB] United Kingdom ............... 9303138

[51] Int. Cl.⁶ ............................................. H03F 3/45
[52] U.S. Cl. ................................... 330/252; 330/310
[58] Field of Search ............... 330/252, 255, 261, 310, 330/311

[56] References Cited
U.S. PATENT DOCUMENTS 3,843,934 10/1974 Giles ................................ 330/260
4,479,094 10/1984 Harris .............................. 330/261

Primary Examiner—Steven Mottola
Attorney, Agent, or Firm—Kirschstein et al.

[57] ABSTRACT

In a differential amplifier having a pair of emitter follower outputs, power saving is obtained by switching the pull-down currents so that the emitter followers have to provide current to drive the load only in the on direction. The preceding stage is a cascode stage, so that the switching signals for switching the pull-down currents may be derived from the emitter circuits of the cascode stage output transistors.

4 Claims, 2 Drawing Sheets

INTEGRATED CIRCUIT AMPLIFIER ARRANGEMENTS

BACKGROUND OF THE INVENTION

The present invention relates to integrated circuit amplifiers, and in particular although not exclusively the invention relates to a preamplifier circuit suitable for prescalers fabricated on high speed bipolar processes. The proposed circuit is also suitable as a differential clock (or data) buffer for ECL and CML logic, limiting amplifier, or LO driver for active mixer circuits etc.

The circuit technique was developed to minimise power consumption in the preamplifier of low voltage prescalers. In this application, amplification of low level RF input signals is required to establish clock drive signals suitable for driving the first divider circuits.

SUMMARY OF THE INVENTION

According to the present invention in an integrated circuit amplifier arrangement comprising a differential cascode stage followed by a pair of emitter followers to inputs of which the outputs of said differential cascode stage are connected respectively, there are provided respective transistor switching means in the emitter circuits of said emitter followers, said switching means being controlled in dependence upon signals derived from said differential cascode stage.

BRIEF DESCRIPTION OF THE DRAWINGS

Amplifier arrangements in accordance with the present invention will now be described by way of example with reference to the accompanying drawings, of which

DETAILED DESCRIPTION OF THE PREFERRED EMBODIMENTS

Figure 1:
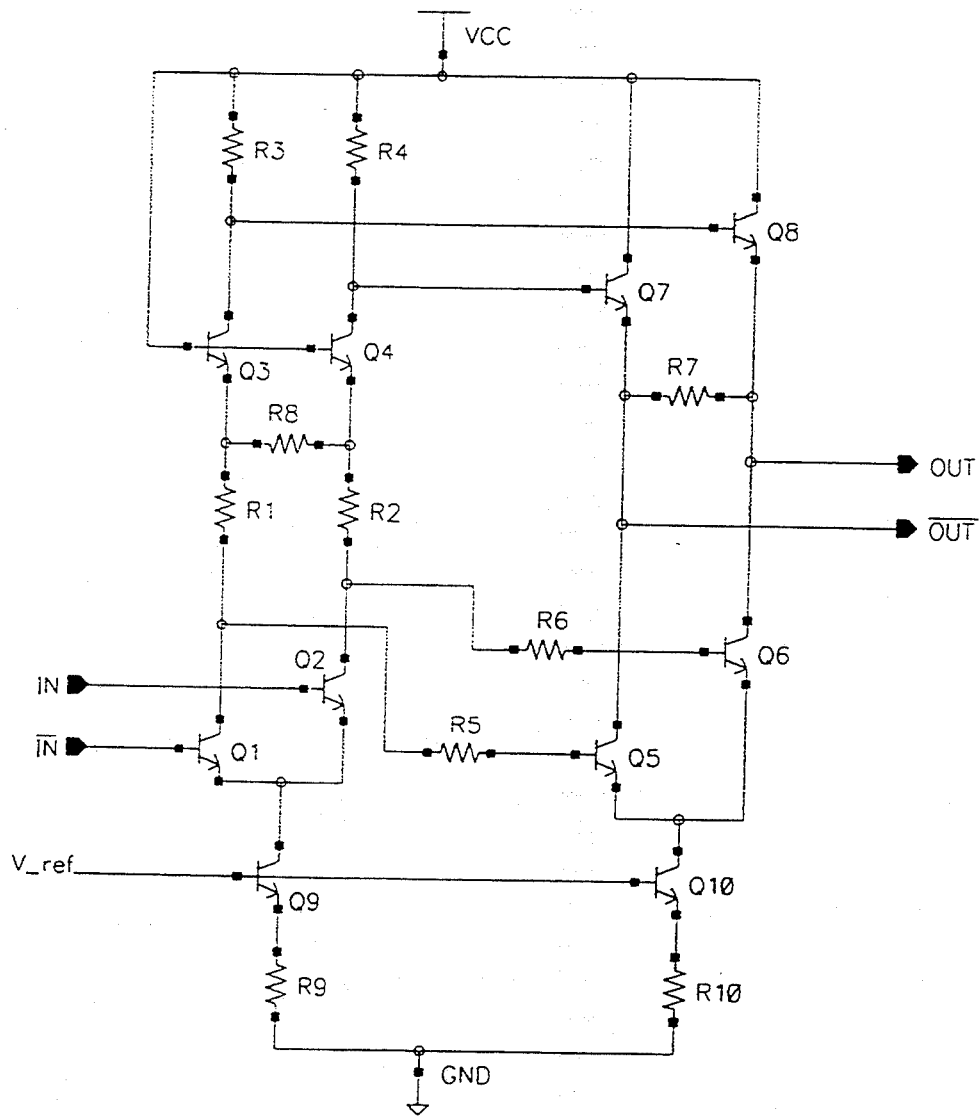
FIGS. 1 and 2 show two embodiments.

The basic circuit principles are described with reference to FIG. 1. From this it can be seen that the preamplifier consists of two sections. The input is a differential cascode stage, incorporating transistors Q1 to Q4, which provides the main voltage amplification. A low impedance output drive stage is then provided by means of emitter followers Q7 and Q8 with a switched pull down current.

Power saving is obtained by the switching of the emitter follower pull down current. This directly results in a saving of half the current consumption in this section, the magnitude of this current being chosen to be sufficient to provide the negative output slew rates required. Due to the switching of the pull down current, the emitter follower transistors now only have to provide current to drive the load (on the output terminals) on the positive going transitions. Previously the emitter followers would have had to drive the load and overcome the pull down currents. A benefit resulting from this reduced loading of the emitter followers is to reduce their drive requirements on the previous cascode stage, hence reducing its power consumption.

Previously other circuits have been proposed that switch the emitter follower tail currents. The novelty of this proposal is in the utilisation of signals appearing on the emitters of the cascode transistors Q3 and Q4 to provide the base drive to switching transistors Q5 and Q6. Note that no additional power consuming bias circuitry has been required to provide the correct bias conditions for these transistors.

Another benefit of utilising this drive to the current switching transistors is to minimise the time delay in this signal path, hence improving the speed power product of the overall circuit. In practice improved performance can be obtained by matching the delays in the primary signal path to that of the switching of the emitter pulldown current. This is achieved by delaying the switching of Q5 and Q6 by means of drive limiting resistors R5 and R6.

In practice the differential voltage at the emitter terminals of Q3 and Q4 is insufficient to fully switch the current switching transistors Q5 and Q6, particularly with low level input signals. A larger signal to drive these transistors is generated by including resistors R1 and R2. Since these resistors can be kept to relatively low values (compared to the collector resistors R3 and R4), a minimal detriment due to miller effect around Q1 and Q2 will result.

Potentially the active transistors Q3, Q4, Q7 and Q8 could fully turn off resulting in indeterminate emitter voltages. This may be overcome by the inclusion of resistors R7 and R8 or alternatively low value current sources to ground (as shown in the output stage of FIG. 2). These enhancements help to control maximum output amplitude and recovery times (off to on time) of the above transistors, resulting in improved performance over frequency and with unsymmetrical drive waveforms.

Figure 2:
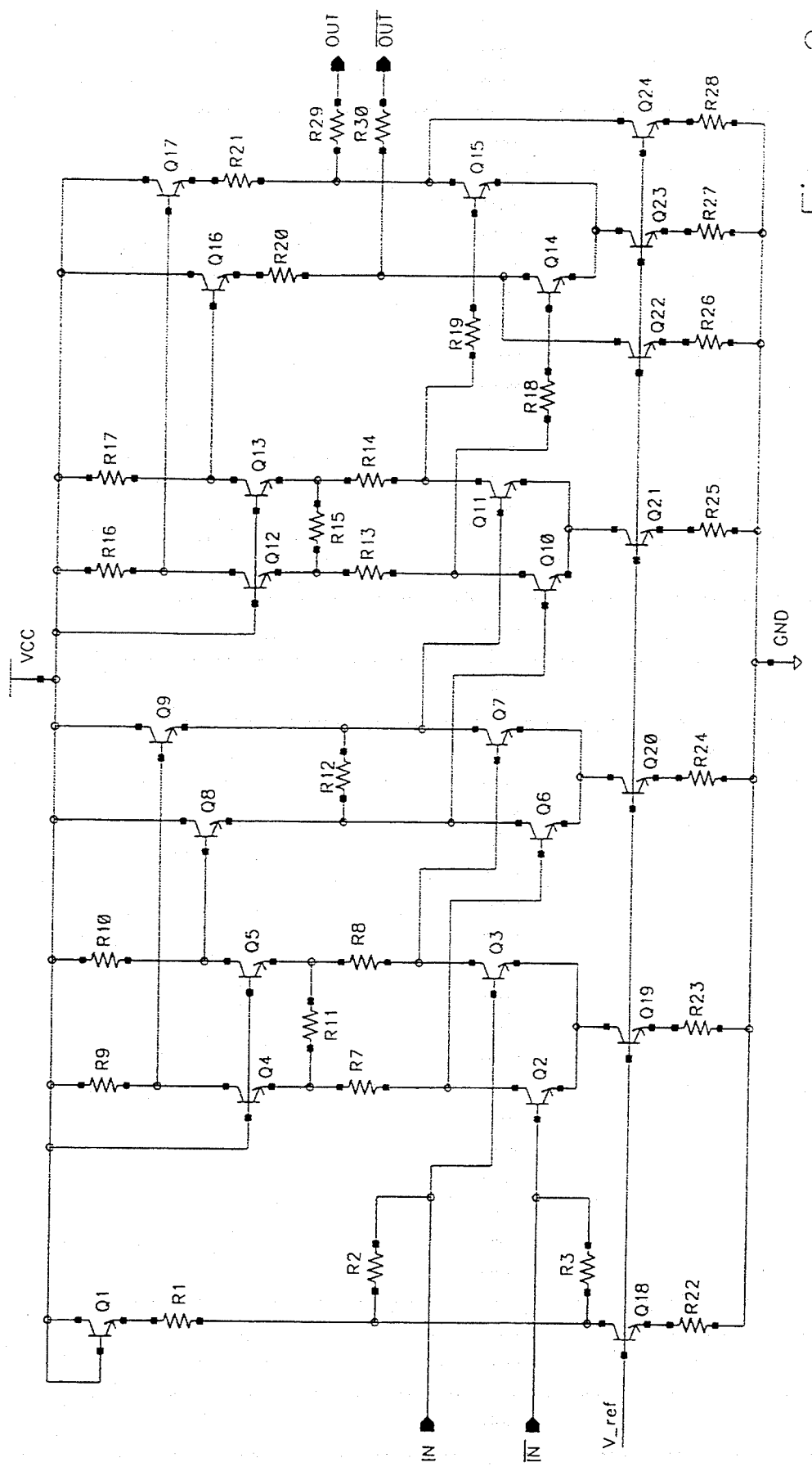

FIG. 2 shows how two preamplifier stages have been biased and cascaded in a practical prescaler circuit. Resistors R20, R21, R29 and R30 have been added to provide additional damping when driving capacitive loads.

I claim:

1. An integrated circuit amplifier arrangement, comprising: first and second bipolar transistors having their emitter electrodes connected together and to a bias current source to form a differential amplifier stage; third and fourth bipolar transistors having their emitter electrodes connected respectively to the collector electrodes of the first and second transistors by way of respective resistive load means; fifth and sixth bipolar transistors connected as emitter followers between collector circuits of said third and fourth transistors respectively and differential outputs of the amplifier arrangement; and seventh and eighth bipolar transistors having their collector electrodes connected to the emitter circuits of the fifth and sixth transistors respectively and having their base electrodes connected to the collector electrodes of the second and first transistors respectively.

2. An integrated circuit amplifier arrangement in accordance with claim 1, wherein the emitter electrodes of said seventh and eighth transistors are connected together and to a bias current source.

3. An integrated circuit amplifier arrangement, comprising: first and second bipolar transistors having their emitter electrodes connected together and to a bias current source to form a differential amplifier stage; third and fourth bipolar transistors having their emitter electrodes connected respectively to the collector electrodes of said first and second transistors; fifth and sixth bipolar transistors connected as emitter followers between collector circuits of said third and fourth transistors respectively and differential outputs of the amplifier arrangement; respective resistor means connected between the emitter electrodes of said third and fourth transistors and between the emitter electrodes of said fifth and sixth transistors; and seventh and eighth bipolar transistors having their collector electrodes connected to the emitter circuits of the fifth and sixth transistors respectively and having their base electrodes connected to the collector circuits of the second and first transistors respectively.

4. An integrated circuit amplifier arrangement in accordance with claim 3, wherein the emitter electrodes of said seventh and eighth transistors are connected together and to a bias current source.

* * * * *